(12) United States Patent
Park et al.

(10) Patent No.: US 9,236,309 B2
(45) Date of Patent: Jan. 12, 2016

(54) METHODS OF FABRICATING SEMICONDUCTOR FIN STRUCTURES

(71) Applicant: GLOBALFOUNDRIES INC., Grand Cayman (KY)

(72) Inventors: Chanro Park, Clifton Park, NY (US); Steven Bentley, Watervliet, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/687,300

(22) Filed: Apr. 15, 2015

(65) Prior Publication Data

US 2015/0340289 A1 Nov. 26, 2015

Related U.S. Application Data

(60) Provisional application No. 62/001,135, filed on May 21, 2014.

(51) Int. Cl.
| | |
|---|---|
| *H01L 21/20* | (2006.01) |
| *H01L 21/8234* | (2006.01) |
| *H01L 21/762* | (2006.01) |
| *H01L 21/306* | (2006.01) |
| *H01L 21/308* | (2006.01) |
| *H01L 21/02* | (2006.01) |

(Continued)

(52) U.S. Cl.
CPC .... *H01L 21/823431* (2013.01); *H01L 21/0217* (2013.01); *H01L 21/3081* (2013.01); *H01L 21/30604* (2013.01); *H01L 21/76224* (2013.01); *H01L 21/823481* (2013.01); *H01L 29/161* (2013.01); *H01L 29/165* (2013.01)

(58) Field of Classification Search
CPC ....... H01L 21/02; H01L 21/336; H01L 21/76; H01L 29/78; H01L 21/845; H01L 29/785; H01L 21/20; H01L 21/84; H01L 21/3065; H01L 29/7851
See application file for complete search history.

(56) References Cited

U.S. PATENT DOCUMENTS

| | | | |
|---|---|---|---|
| 5,963,811 | A | 10/1999 | Chern |
| 6,635,543 | B2 | 10/2003 | Furukawa et al. |
| 7,871,873 | B2 | 1/2011 | Maszara et al. |

(Continued)

OTHER PUBLICATIONS

Bentley et al., "Semiconductor Devices Including an Electrically-Decoupled Fin and Methods of Forming the Same", U.S. Appl. No. 14/274,406, filed May 9, 2014 (20 pages).

*Primary Examiner* — Selim Ahmed
(74) *Attorney, Agent, or Firm* — Heslin Rothenberg Farley & Mesiti P.C.; Nicholas Mesiti, Esq.

(57) ABSTRACT

Methods of fabricating one or more semiconductor fin structures are provided which include: providing a substrate structure including a first semiconductor material; providing a fin stack(s) above the substrate structure, the fin stack(s) including at least one semiconductor layer, which includes a second semiconductor material; depositing a conformal protective film over the fin stack(s) and the substrate structure; and etching the substrate structure using, at least in part, the fin stack(s) as a mask to facilitate defining the one or more semiconductor fin structures. The conformal protective film protects sidewalls of the at least one semiconductor layer of the fin stack(s) from etching during etching of the substrate structure. As one example, the first semiconductor material may be or include silicon, the second semiconductor material may be or include silicon germanium, and the conformal protective film may be, in one example, silicon nitride.

20 Claims, 10 Drawing Sheets

(51) Int. Cl.
    *H01L 29/165* (2006.01)
    *H01L 29/161* (2006.01)

(56) References Cited

U.S. PATENT DOCUMENTS

2006/0071213 A1    4/2006  Ma et al.
2007/0000897 A1    1/2007  Ingle et al.
2010/0163971 A1    7/2010  Hung et al.
2014/0065832 A1*   3/2014  Hsieh .................. G03F 7/70683
                                                           438/703
2015/0001591 A1    1/2015  Akarvardar et al.
2015/0021690 A1    1/2015  Jacob et al.
2015/0021709 A1    1/2015  Jacob et al.
2015/0024572 A1    1/2015  Jacob et al.

* cited by examiner

METHODS OF FABRICATING SEMICONDUCTOR FIN STRUCTURES

CROSS-REFERENCE TO RELATED APPLICATION

This application claims the benefit of U.S. provisional patent application Ser. No. 62/001,135, filed May 21, 2014, which is hereby incorporated herein by reference in its entirety.

FIELD OF THE INVENTION

The present invention relates to methods of facilitating fabricating fin structures, such as semiconductor fin structures extending from a substrate structure for use in integrated circuit fabrication.

BACKGROUND OF THE INVENTION

Fin field-effect transistor (FinFET) devices are currently being developed to replace conventional planar metal oxide semiconductor field-effect transistors (MOSFETs) in advanced complementary metal oxide semiconductor (CMOS) technology due to their improved short-channel effect immunity and higher on-current to off-current ratio ($I_{on}/I_{off}$). As is known, the term "fin" refers to a vertical structure within or upon which are formed, for instance, one or more FinFETs or other fin devices, such as passive devices, including capacitors, diodes, etc.

Further enhancements in fin structures and fabrication methods therefor continue to be pursued for enhanced performance and commercial advantage.

BRIEF SUMMARY

The shortcomings of the prior art are overcome, and additional advantages are provided, through the provision, in one aspect, a method which includes fabricating one or more semiconductor fin structures. The fabricating includes: providing a substrate structure including a first semiconductor material; providing one or more fin stacks above the substrate structure, one fin stack of the one or more fin stacks including at least one semiconductor layer including a second semiconductor material; depositing a conformal protective film over the one or more fin stacks and the substrate structure; and etching the substrate structure using, at least in part, the one or more fin stacks as a mask to facilitate defining the one or more semiconductor fin structures, wherein the conformal protective film protects the sidewalls of the at least one semiconductor layer from etching during the etching of the substrate structure.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Also note that reference is made below to the drawings, which are not drawn to scale for ease of understanding, and where the same reference numbers used throughout different figures designate the same or similar elements or components.

In fabricating electronic circuits, including, for example, integrated circuits (ICs) or semiconductor devices, the density of components continues to increase to achieve greater functionality and reduced manufacturing costs. This desire for large scale integration has led to a continued shrinking of circuit dimensions and component features. The ability to reduce size of component features is driven, at least in part, by performance enhancements in manufacturing processes by which circuit structures are formed on a wafer.

One aspect of integrated circuit fabrication (which is also referred to herein as semiconductor device fabrication) typically involves use of fabrication processes such as lithography processes for transferring a mask pattern to a wafer, with subsequent etching to remove unwanted material. Lithography and etch processes may be used, for instance, to facilitate forming circuit structures such as fin structures and/or gate structures. In one illustrative example, fin structures and gate structures may be fabricated via a sidewall image transfer (SIT) (or self-aligned double patterning (SADP)) process. The SIT process is sometimes referred to as an SADP process, due to the doubling of the number of lined structures from the number of mandrels.

Traditional lithography techniques to pattern lined structures are becoming more difficult, and expensive, due to the fundamental limits in optical resolution. In the SIT process, however, lithography is used as a starting point to pattern lines, followed by materials processing to produce smaller, narrower lines, thus avoiding the fundamental physical limits of resolution. In the SIT process, a film on the sidewall of a line structure, referred to as a mandrel, is used as the template from which to pattern the structure underneath it. When the mandrel is removed, the sidewalls remain, and may be used as a mask to pattern one or more underlying layers.

By way of example, FIGS. 1A-1G depict one embodiment of an SIT process to facilitate fabrication of semiconductor fin structures.

Figure 1A:
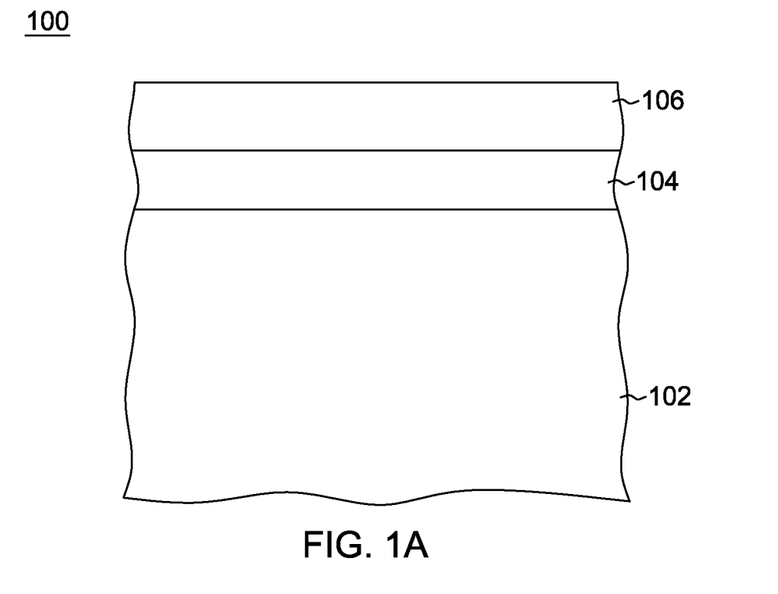
FIGS. 1A-1G schematically illustrate one example of manufacturing fin structures and/or gate structures using a semiconductor device fabrication process to be enhanced, in accordance with one or more aspects of the present invention.
Figure 1B:
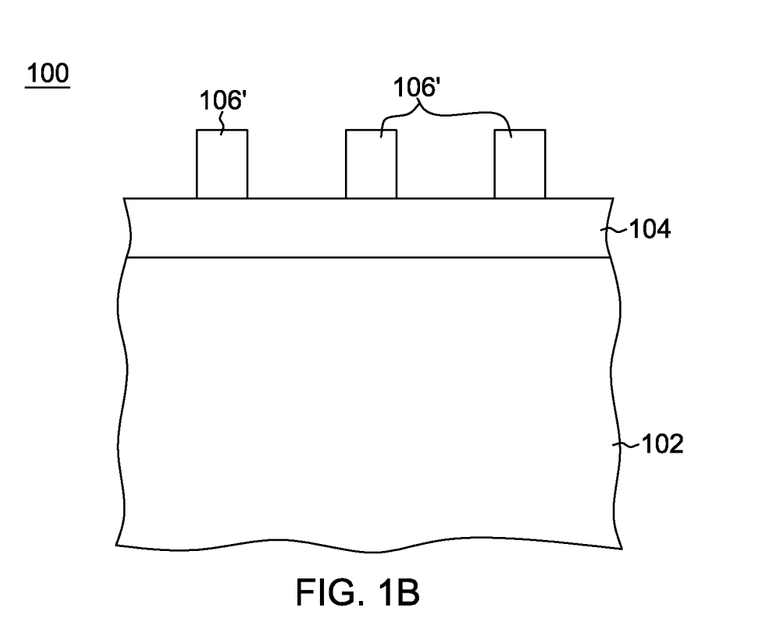

Referring to FIG. 1A, the fin fabrication process may obtain an intermediate structure 100, which includes a substrate 102, a layer 104 disposed over substrate 102, and a mask layer 106 disposed over layer 104. Intermediate structure 100 might be an entire semiconductor wafer or a portion thereof. Substrate 102 can include, for example, a semiconductor material, such as, e.g., silicon (Si), germanium (Ge), a compound semiconductor material, a layered semiconductor material, a silicon-on-insulator (SOI) material, a SiGe-on-insulator (SGOI) material, or a germanium-on-insulator (GOI) material, etc. Layer 104 may be or may include one or more layers of conductive material(s), dielectric material(s), and/or semiconductor material(s) provided over substrate 102 using a variety of techniques. In one specific example of interest herein, layer 104 is a semiconductor layer over a semiconductor substrate 102. For instance, layer 104 may include, at least in part, a different semiconductor material from a semiconductor material of semiconductor substrate 102. In one example, the semiconductor substrate includes silicon, and the semiconductor layer 104 over the semiconductor substrate includes silicon germanium, or other III-V elements of the periodic table. Mask layer 106 may include one or more of a variety of sacrificial materials, such as a dielectric material, or a deposited amorphous silicon, carbon, or other similar material, and be formed using any suitable technique, for example, spin coating deposition over layer 104.

Intermediate structure 100 is subjected to one or more lithographic processing steps. A desired pattern is transferred to sacrificial mask layer 106 by providing an appropriately patterned photoresist layer (not shown) over the layer, which may be employed to form an array of structures, such as the mandrel lines 106' illustrated in FIG. 1B, which in one example may extend as parallel lines over at least a portion of the wafer.

Figure 1C:
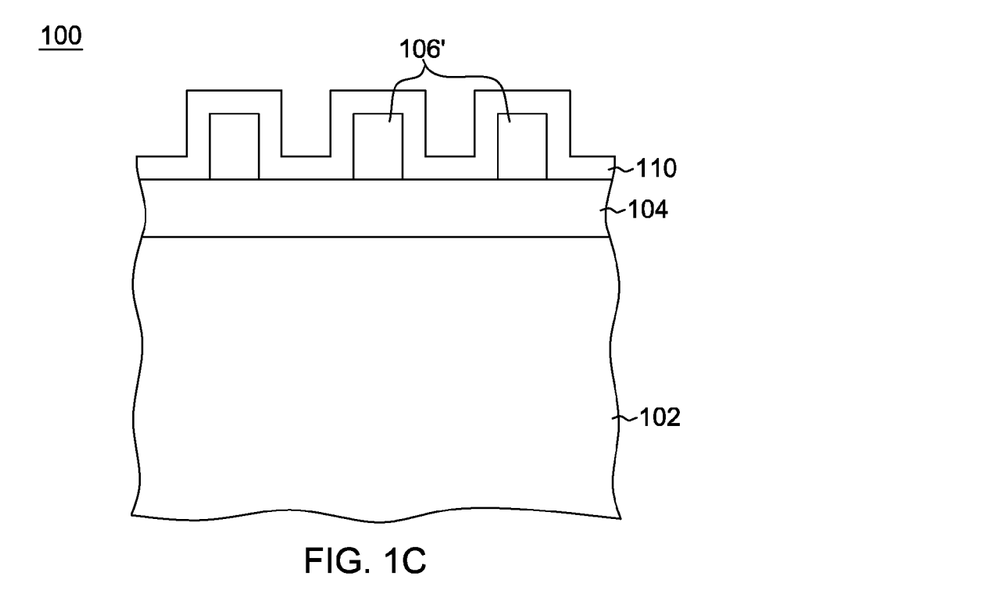

The sidewall image transfer process includes a spacer or hard mask layer 110 being conformally deposited over structure 100, as illustrated by FIG. 1C. Spacer layer 110, which might include an oxide (such as, for example, silicon oxide $SiO_2$), a nitride (such as, for example, silicon nitride, $Si_3N_4$), an oxynitride (such as, for example, silicon oxynitride, $SiO_xN_y$) etc., may be conformally deposited using a variety of techniques, such as, for example, chemical vapor deposition (CVD) or atomic layer deposition (ALD). In one specific example, silicon nitride may be deposited using process gasses such as, for example dichlorosilane ($SiH_2Cl_2$) and ammonia ($NH_3$), and known process conditions.

Figure 1D:
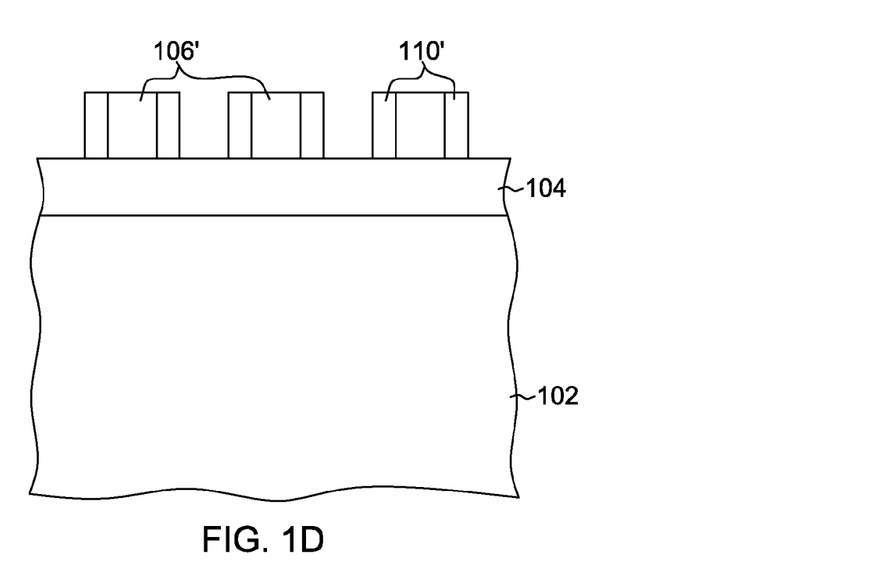
Figure 1E:
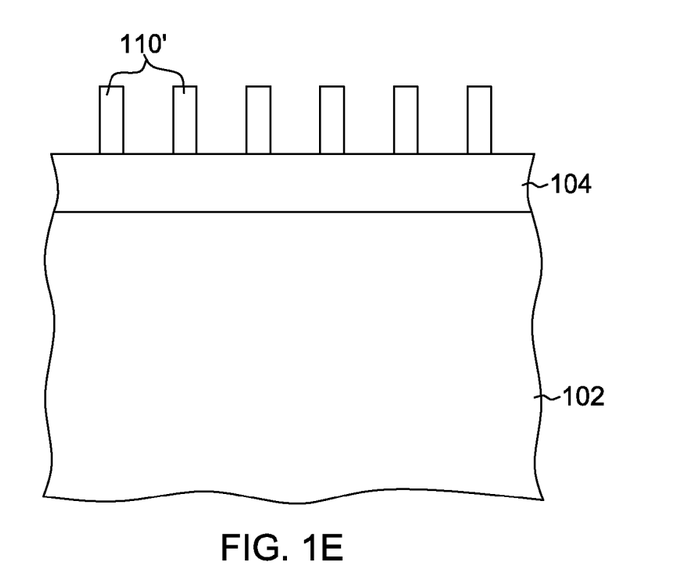

As illustrated in FIG. 1D, spacer layer 110 is etched, for instance, by any appropriate combination of dry and wet etching, to form sidewall spacers 110' adjacent to or along the sidewalls of mandrel lines 106'. Spacer layer 110 may be etched using, for instance, any appropriate etching processes, such as (for example) hard-mask open (HMO) step to form sidewall spacers 110'. Following sidewall-spacer formation, the mandrel lines may be removed by selective etching of the lines, leaving sidewall spacers 110', as illustrated in FIG. 1E. Fin stacks 112 are subsequently defined by (for instance) partially or fully etching layer 104, as depicted in FIG. 1F, after which, substrate 102 may be etched using, at least in part, fin stacks 112 to define semiconductor fin structures 120, as depicted in FIG. 1G.

Figure 1F:
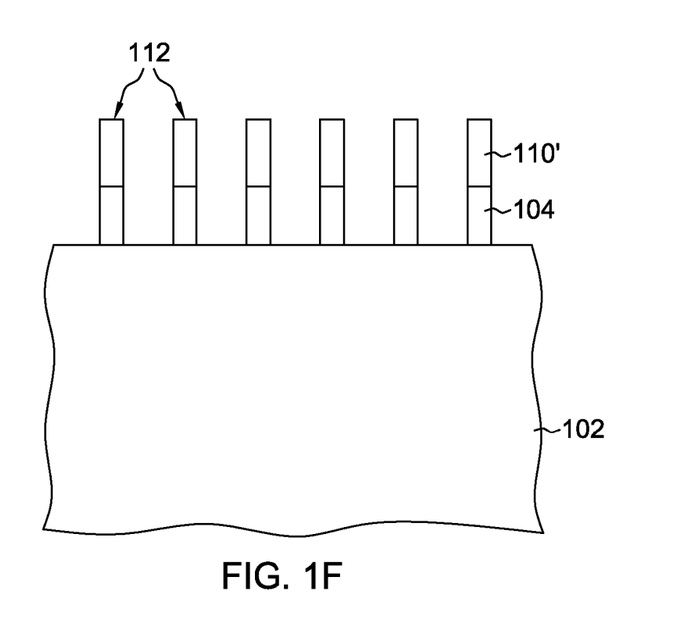
Figure 1G:
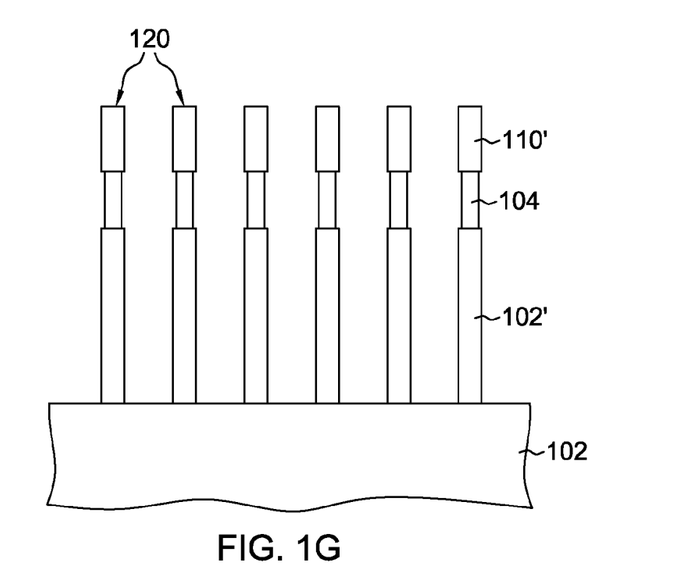

FIG. 1G illustrates an issue encountered in semiconductor fin structure fabrication processing such as outlined in FIGS. 1A-1G. In particular, where layer 104 is a semiconductor material layer, the exposed sidewalls of semiconductor layer 104 within the fin stacks 112 may be etched during etching of the substrate structure. This is particularly true in embodiments where the semiconductor substrate includes or is formed of silicon, such as a silicon wafer, and the semiconductor layer 104 is, for instance, silicon germanium. Note that the oxidation rate of the silicon germanium layer is substantially greater than the oxidation rate of the silicon wafer. In such an implementation, the silicon germanium layer or portion of the semiconductor fin structures will be attacked during wet or dry etching of the substrate structure, resulting in a non-aligned sidewall fin profile. For instance, the fins may actually step or angle in, in the region of the silicon germanium layer of the fin stack, as illustrated in FIG. 1G. Thus, disclosed hereinbelow with reference to FIGS. 2A-3H are alternate process embodiments for fabricating semiconductor fin structures with enhanced sidewall protection, to ensure enhanced vertical sidewall uniformity or alignment.

Figure 2A:
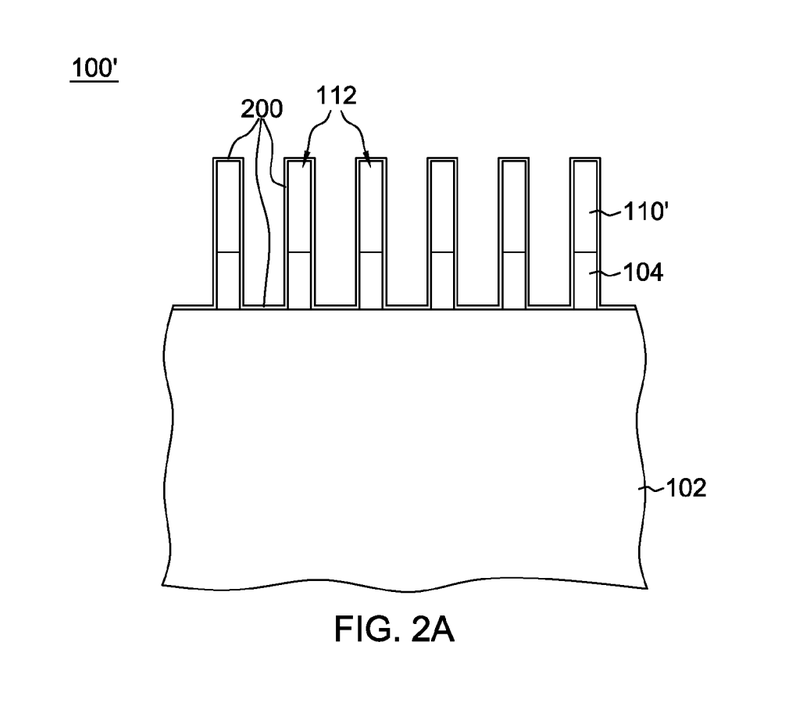
FIG. 2A depicts the intermediate structure of FIG. 1F, with a conformal protective film having been provided over the fin stacks and the substrate structure, in accordance with one or more aspects of the present invention.

Referring to the process flow of FIGS. 2A-2D, a structure 100' is illustrated in FIG. 2A similar to structure 100 of FIG. 1F, with the exception of the addition of a conformal protective film 200 over the fin stacks 112 above semiconductor substrate 102. In one embodiment, the conformal protective film or liner 200 may be the same or a different material from hard mask layer 110' of fin structures 112. By way of example, the hard mask layers of the fin stacks 112 and the conformal protective film 200 may be or include silicon nitride. Further, thickness of the conformal protective film 200 may vary depending on the material etch processes employed. The thickness is chosen to ensure protection of semiconductor layer 104 sidewalls during subsequent etching of substrate 102. By way of example, thickness of conformal protective film 200 may be in the range of about 0.5 nanometers to 10 nanometers to accomplish the desired function. The protective layer may be conformally applied over fin stacks 112 and the upper surface of substrate 102 using, for instance, an atomic layer deposition process or chemical vapor deposition process. Advantageously, the conformal protective film, in addition to protecting semiconductor layer 104 sidewalls during etching of the substrate, also inhibits or protects the semiconductor layer 104 sidewalls from oxidation. Note also that the exemplary silicon nitride is presented by way of example only. Other conformal protective films, such as aluminum oxide, a low-k dielectric film (e.g., SiBCN), a high-k dielectric film (e.g., $HfO_2$), etc., might alternatively be employed.

Figure 2B:
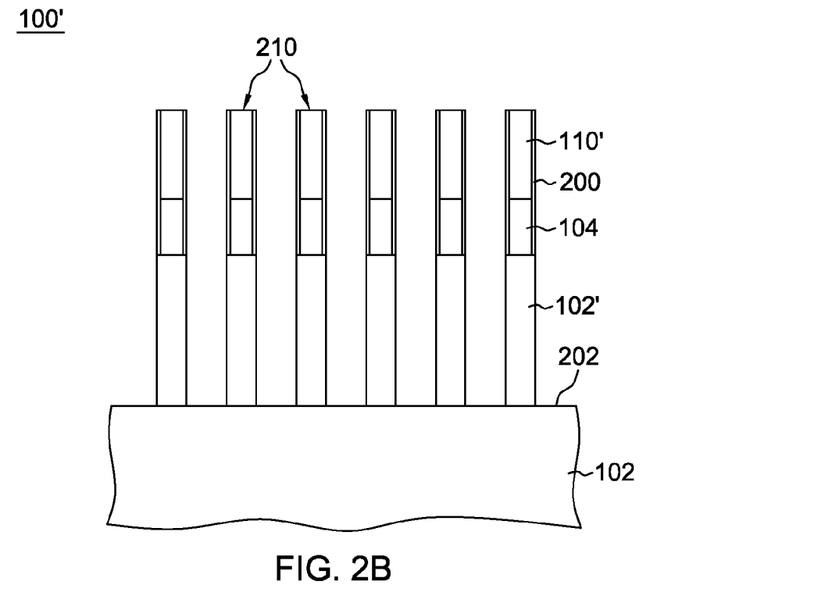
FIG. 2B depicts the structure of FIG. 2A, after etching of the substrate structure, to define semiconductor fin structures, in accordance with one or more aspects of the present invention.
Figure 2C:
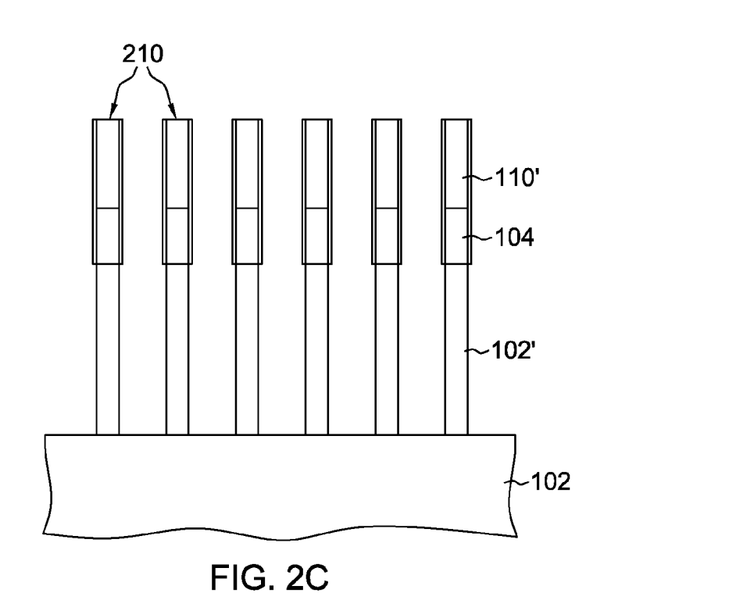
FIG. 2C depicts the structure of FIG. 2B, after an optional sidewall etching of the semiconductor substrate material within the semiconductor fin structures to remove the step in the extended fin structure profiles resulting from the conformal protective film, in accordance with one or more aspects of the present invention.

In FIG. 2B, an anisotropic etch or breakthrough process has been performed to remove horizontal portions of conformal protective film 200 from over an upper surface 202 of substrate structure 102, as well as from over hard mask layer 110' of the fin stacks. Additionally, FIG. 2B illustrates structure 100' after etching of semiconductor substrate 102 such that the semiconductor fin structures 210 are extended into the substrate material and portions of the semiconductor substrate material 102' form base layers within the semiconductor fin structures 210. The resultant semiconductor fin structures 210 are illustrated as extending from an upper surface 202 of semiconductor substrate 102 and include, at this point, semiconductor layers 102' of the same material as semiconductor substrate 102. The semiconductor layers 102' of the fin structures are, in one example, slightly wider than semiconductor layers 104 in the fin structures due to the presence of the conformal protective film 200 on the sidewalls thereof during etching of the semiconductor substrate 102. Depending on the thickness of conformal protective film 200, and the particular processes and devices being fabricated, it may be desirable to optionally laterally etch the semiconductor layers 102' of the fin structures in order that sidewalls of the different layers within the individual semiconductor fin structures 210 align. This is illustrated in FIG. 2C where the lateral sidewalls of semiconductor layers 102' of the semiconductor fin structures 210 are recessed in below the semiconductor layers 104 with the conformal protective film 200 over the sidewalls, which may be achieved using an oxidation and etch process.

Figure 2D:
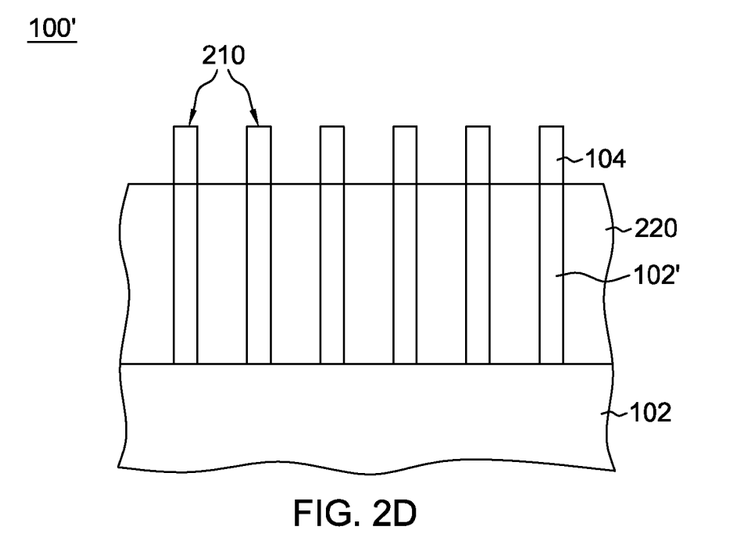
FIG. 2D depicts the structure of FIG. 2C, after provision of an isolation material at least partially filling the spaces between the semiconductor fin structures, and after removal of the conformal protective film and hard mask layer above the semiconductor layers of the semiconductor fin structures, in accordance with one or more aspects of the present invention.

As illustrated in FIG. 2D, the conformal protective film or liner 200 may be subsequently removed from structure 100', leaving semiconductor fin structures 210, each including semiconductor layer 104 above semiconductor layer 102', where semiconductor layer 102' is, in one example, the same semiconductor material as semiconductor substrate 102, and semiconductor layer 104 is, at least in part, a different semiconductor material. As one example, semiconductor layer 102' may be or include silicon, and semiconductor layer 104 may be or include silicon germanium. As illustrated in FIG. 2D, a dielectric material 220, such as silicon oxide may be provided in the spaces between semiconductor fin structures 210. Removal of the conformal protective film 200 and hard mask layer 110' (see FIGS. 2B & 2C) may be performed prior to or after provision of dielectric material 220 between semiconductor fin structures 210.

As noted, FIGS. 3A-3H depict another fin fabrication process flow, in accordance with one or more aspects of the present invention. In the embodiment of FIGS. 3A-3H, silicon germanium fin protection is described using silicon nitride to provide silicon-on-nothing, or dielectric isolation to silicon-germanium fins. The processing can be employed to achieve partial or full isolation of the fins from the underlying substrate structure, as described below.

Figure 3A:
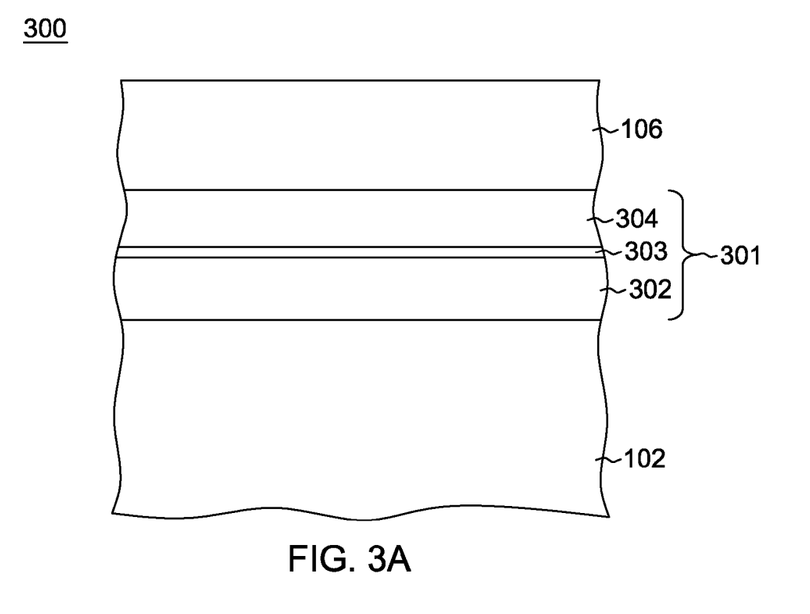
FIG. 3A depicts a partial cross-sectional elevational view of another embodiment of an intermediate structure, obtained during a fabrication process, in accordance with one or more aspects of the present invention.

In the embodiment shown, an intermediate structure 300 is obtained, as shown in FIG. 3A, which includes (by way of example) a substrate 102, semiconductor layers 301 disposed over substrate 102, and a photoresist layer 106 disposed over semiconductor layers 301. In one embodiment, semiconductor layers 301 include a first semiconductor layer 302 over substrate 102, a second semiconductor layer 303 over first semiconductor layer 302, and at least one semiconductor layer 304 disposed over second semiconductor layer 303. By way of example, first semiconductor layer 302 and the at least one semiconductor layer 304 may be or include the same semiconductor material, such as silicon germanium, with second semiconductor layer 303 being or including a different semiconductor material, such as silicon. In one implementation, first semiconductor layer 302 is epitaxially grown from a silicon substrate 102 as a silicon germanium layer, after which second semiconductor layer 303 is epitaxially grown as a silicon layer from the first semiconductor layer 302.

For example, silicon germanium layer 302, which may be expressed as $Si_{1-x}Ge$, wherein x, the atomic ratio of germanium in silicon, may be anywhere in the range of 0<x<1, and may be formed from a silicon substrate 102 using (for instance) various epitaxial growth processes, such as ultra-high vacuum chemical vapor deposition (UHV-CVD), low-pressure CVD (LPCVD), reduced pressure CVD (RPCVD), rapid thermal CVD (RTCVD), metal-organic CVD (MOCVD), or molecular beam epitary (MBE). In another example, a silicon layer may be epitaxially grown over the first semiconductor layer 302 by flowing a reactant gas, such as dichlorosilane ($SiH_2Cl_2$), trichlorosilane ($SiHCl_3$), silicon tetrachloride ($SiCl_4$), or silane ($SiH_4$), together with a carrier gas, such as hydrogen gas, to form a uniform silicon semiconductor layer 303.

The process repeats to form the at least one semiconductor layer 304, where the at least one semiconductor layer 304 may be or include a silicon germanium layer. Note that the semiconductor materials chosen for the semiconductor layers may vary from the examples described herein. Also, those skilled in the art will note that the percentage of germanium within the epitaxially grown layers 301 may vary from layer to layer. The tri-layer arrangement illustrated in FIG. 3A advantageously may be employed to provide silicon-on-nothing fin structures, or silicon-on-insulator fin structures, as described below.

Figure 3B:
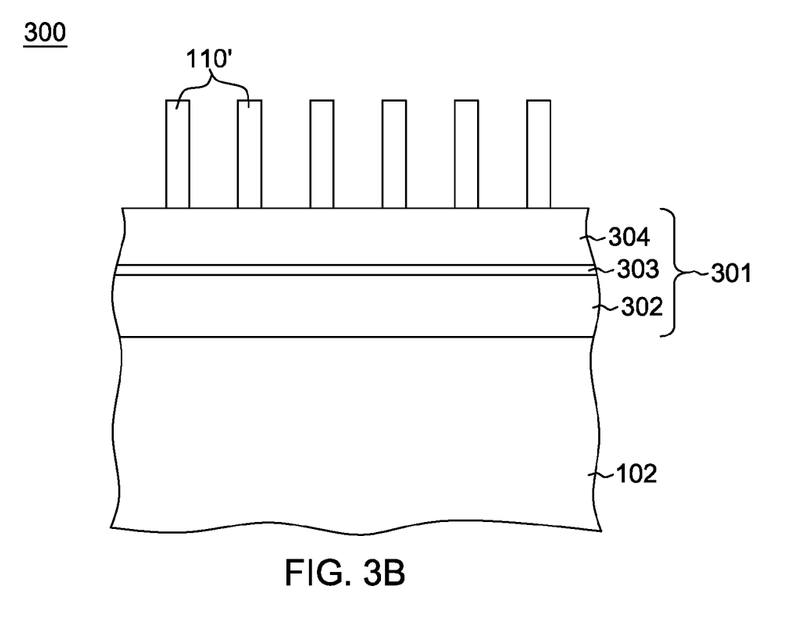
FIG. 3B depicts the structure of FIG. 3A, after patterning of the hard mask layer using, for instance, sidewall image transfer processing such as depicted above in connection with FIGS. 1A-1E, in accordance with one or more aspects of the present invention.

As illustrated in FIG. 3B, hard mask layer 106 is patterned, using a sidewall image transfer process such as described above in connection with FIGS. 1A-1F, to provide a pattern of sidewall spacers 110' above the tri-layer semiconductor structure.

Figure 3C:
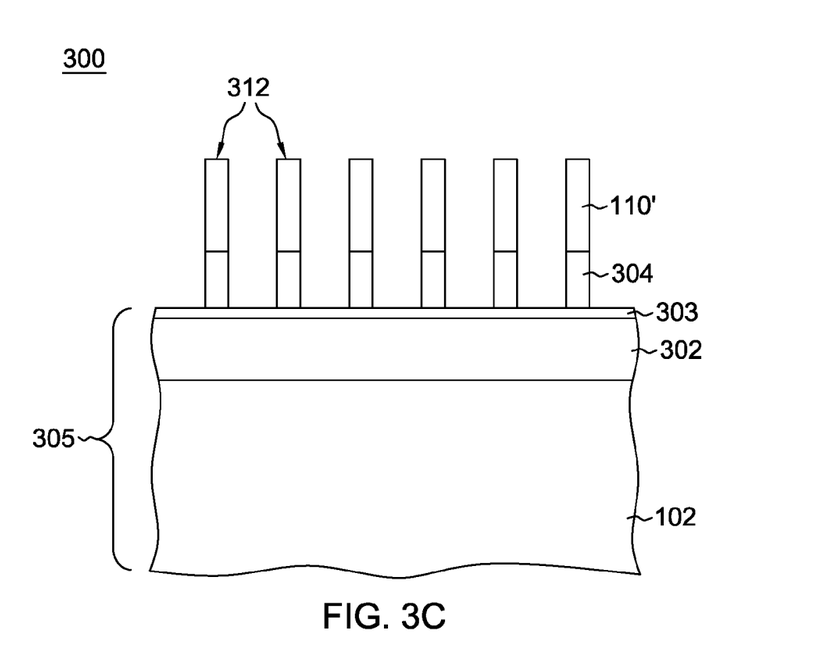
FIG. 3C depicts the structure of FIG. 3B, after creating multiple fin stacks over the substrate structure by etching at least one semiconductor layer of the epitaxially-grown semiconductor layers of FIGS. 3A & 3B, in accordance with one or more aspects of the present invention.

Next, as illustrated in FIG. 3C, the at least one semiconductor layer 304 is etched to form fin stacks 312 above a multilayer substrate structure 305 including semiconductor substrate 102, first semiconductor layer 302, and second semiconductor layer 303.

Figure 3D:
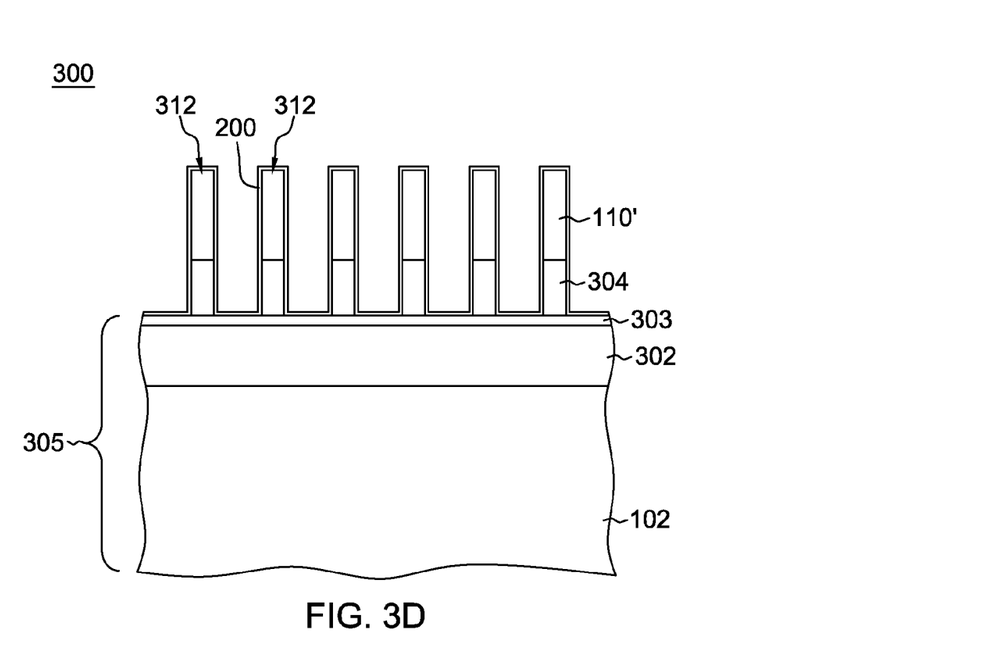
FIG. 3D depicts the structure of FIG. 3C, after deposition of a conformal protective film over the fin stacks and substrate structure, in accordance with one or more aspects of the present invention.

FIG. 3D illustrates structure 300 of FIG. 3C, after deposition of a conformal protective film 200 over the fin stacks 312 above multilayer substrate structure 305.

In one embodiment, the conformal protective film 200 may be deposited by atomic layer deposition, and a variety of protective films could be employed to achieve the design goal of encapsulating the at least one semiconductor layer 304 of the fin stacks 312 to prevent subsequent etching of semiconductor layer 304 sidewalls with etching of the underlying multilayer substrate structure 305, as well as advantageously prevent oxidation of the sidewall surfaces during subsequent processing. As noted above, as one example, the hard mask layers or sidewall spacers 110', and the conformal protective film 200 may be or include the same protective material, such as silicon nitride. Alternatively, the hard mask layers 110' and the conformal protective film may be different protective materials, if desired. For instance, the hard mask layers 110' might be formed of silicon nitride, and the conformal protective film could be, for instance, aluminum oxide, a low-k dielectric film, etc. Further, thickness of the conformal protective film 200 can vary, depending on the materials and/or etch processes employed, with the thickness being chosen to ensure the goal of protecting semiconductor layer 104 sidewalls during the subsequent etching of the multilayer substrate structure 305. By way of example, thickness of conformal protective film 200 may be in the range of about 0.5 nanometers to 8 nanometers, to accomplish the desired function. The protective layer is conformally applied over the fin stacks 312 and the upper surface of multilayer substrate structure 305.

Figure 3E:
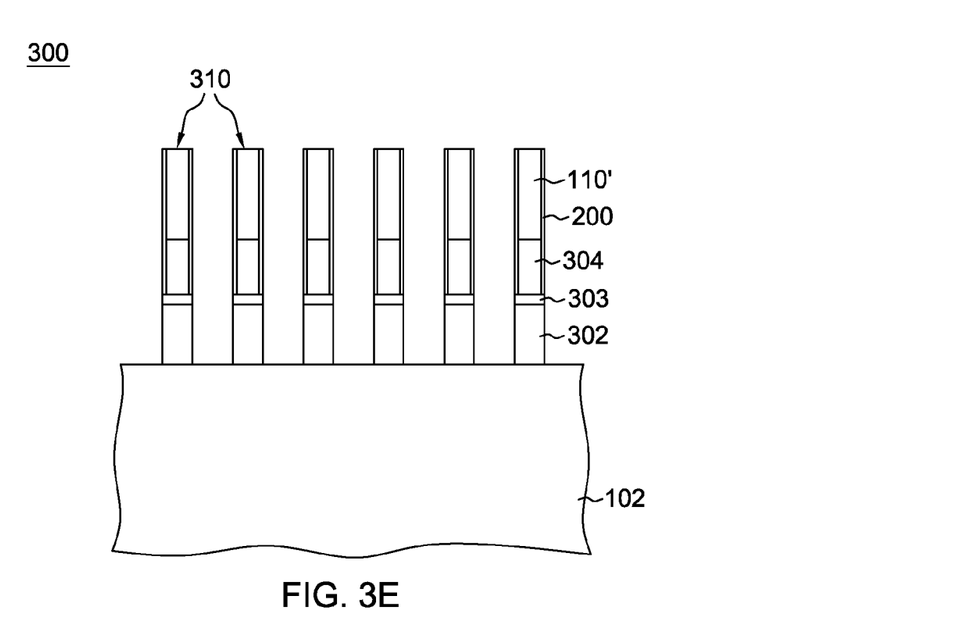
FIG. 3E depicts the structure of FIG. 3D, after removing the conformal protective film from over upper surfaces of the substrate structure, while leaving the conformal protective film over sidewalls of the fin stacks, and etching of the multilayer substrate structure, including etching through (by way of example only) first and second semiconductor layers of the multilayer substrate structure, in accordance with one or more aspects of the present invention.

In FIG. 3E, an anisotropic etch or breakthrough process has been performed to remove horizontal portions of conformal protective film 200 from over the upper surface of multilayer substrate structure 305 of FIG. 3D, which also results in removal of the film from over the hard mask layer 110' of the fin stacks. Additionally, FIG. 3E illustrates structure 300, after etching of the multilayer semiconductor substrate, and in particular, after etching through second semiconductor layer 303 and first semiconductor layer 302, down to semiconductor substrate 102. Note that this particular etched structure is presented by way of example only. For instance, in other embodiments, the fin etching may proceed into semiconductor substrate 102, if desired. The resultant semiconductor fin structures 310 are illustrated extending from an upper surface of semiconductor substrate 102, and include, at this point, first and second semiconductor layers 302, 303, at least one semiconductor layer 304, hard mask layer 110', and conformal protective film 200 on sidewalls of the at least one semiconductor layer 304 and hard mask layer 110'. As noted, the semiconductor layers 302, 304 of the semiconductor fin structures 310 may be or include a first semiconductor material, such as silicon germanium, and the second semiconductor layer 303 may be or include a second semiconductor material, such as silicon.

Figure 3F:
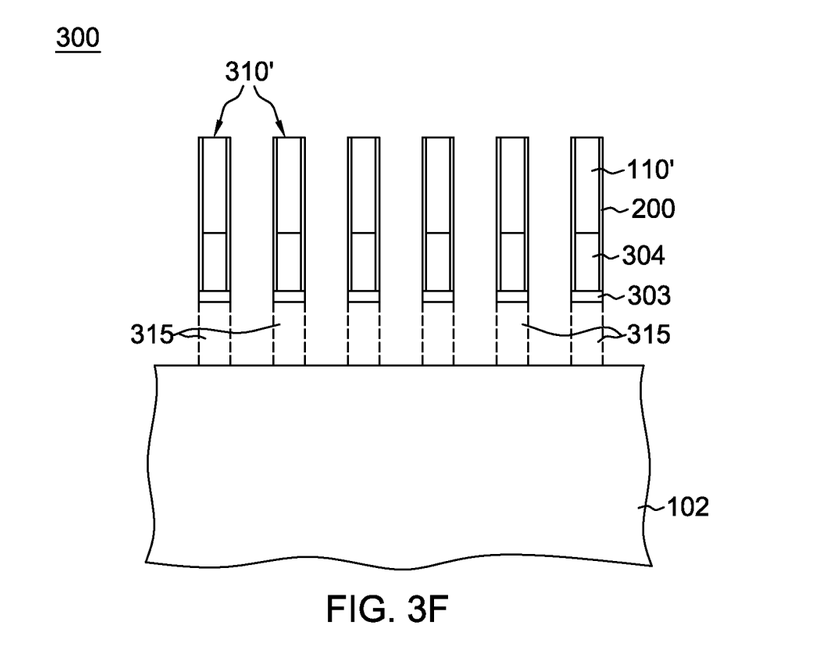
FIG. 3F depicts the structure of FIG. 3E, after removal of the first semiconductor layer disposed over the semiconductor substrate to define silicon-on-nothing semiconductor fin structures, in accordance with one or more aspects of the present invention.

In FIG. 3F, fin fabrication processing proceeds (in one approach) with selective etching of the first semiconductor layers 302 to form openings 315 within semiconductor fin structures 310'. Prior to removal of first semiconductor layers 302 (see FIG. 3E) from the semiconductor fin structures 310', mechanical stabilization of the fin structures may be achieved by, for instance, provision of one or more overlying gate structures (not shown), which would function in part to ensure structural stability of the multiple semiconductor fin structures. The resultant fin structure shown in FIG. 3F is a silicon-on-nothing configuration, where the individual semiconductor fins are isolated from semiconductor substrate 102 by openings 315 in a lower region of the semiconductor fins. Note that in this embodiment, the conformal protective film 200 protects the upper, at least one semiconductor layer 304, of the same material as the first semiconductor layer 302 (see FIG. 3E) being removed. Additionally, second semiconductor layer 303, which is a different material than at least one semiconductor layer 304, protects the at least one semiconductor layer 304 from being exposed to etching along its lower surface. In this approach, the selective removal of the first semiconductor layer thus occurs without channel profile degradation above the removed semiconductor layer.

Figure 3G:
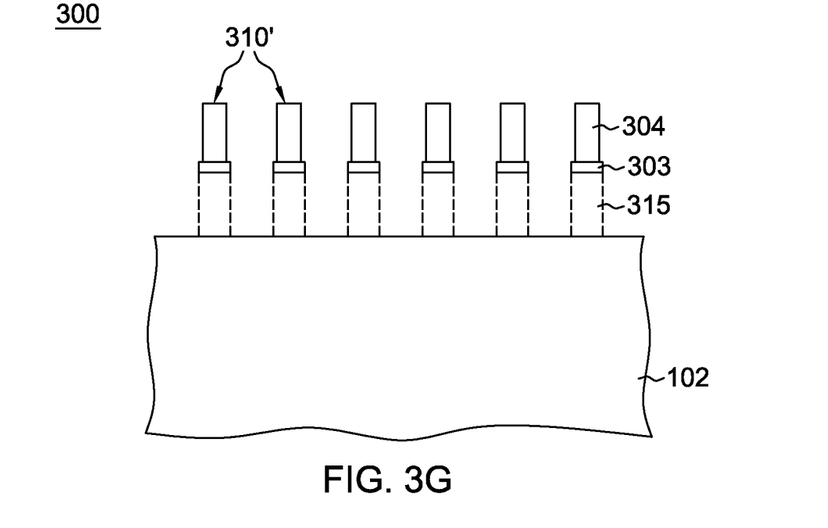
FIG. 3G depicts the structure of FIG. 3F, after removal of the conformal protective film from sidewalls of the semiconductor fin structures, and removal of the hard mask layers from the semiconductor fin structures, in accordance with one or more aspects of the present invention.

One embodiment of the resultant semiconductor fin structures 310' is illustrated in FIG. 3G, wherein semiconductor fins, such as silicon germanium fins, are illustrated on nothing, that is, above openings 315 in the individual fin structures. This structure is achieved by removing conformal protective film 200 and the hard mask layer from the individual semiconductor fin structures 312. Note that, as a result, the width of second semiconductor layer 303 may be slightly wider than the width of the at least one semiconductor layer 304 due to the thickness of the removed conformal protective film. Similar processing to that described above in connection with FIG. 2C could be employed in this process flow to narrow the width of the second semiconductor layer 303, if desired, to maintain sidewall alignment within the individual semiconductor fin structures 310'.

Figure 3H:
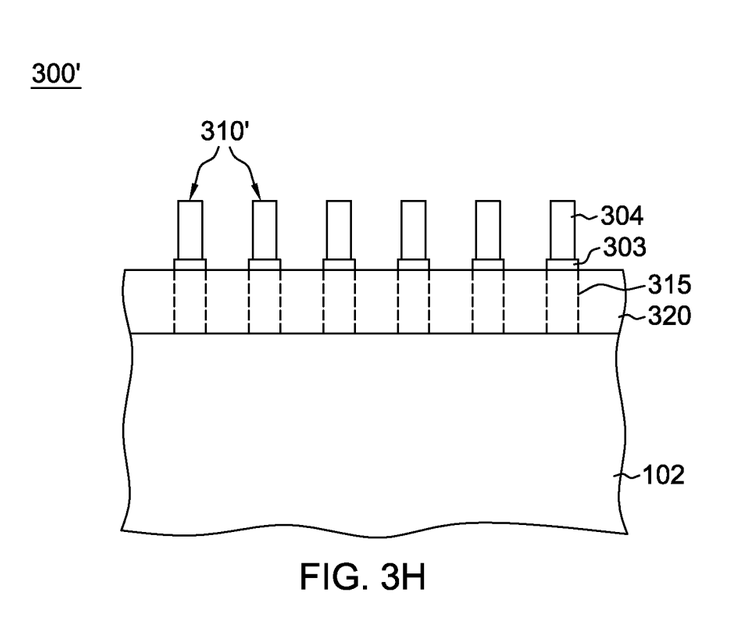
FIG. 3H depicts an alternate embodiment of the structure of FIG. 3G, wherein an insulator is provided over the semiconductor substrate, filling the openings defined within the semiconductor fin structures by removal of the first semiconductor layer from the semiconductor fin structures, to define silicon-on-insulator fin structures, in accordance with one or more aspects of the present invention.

As a further process variation, the structure of FIG. 3G can be processed to provide semiconductor-on-insulator fins such as illustrated in FIG. 3H by filling the openings 315 within a dielectric or insulator material 320 within and in between the individual semiconductor fin structures 310'. For instance, a silicon germanium-on-insulator structure can be achieved by providing the illustrated dielectric isolation. In one example, a flowable oxide or an interlayer dielectric (ILD), such as silicon dioxide, may be employed to fill the space between the semiconductor fins and within the openings in the individual semiconductor fins depicted in FIG. 3G.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
fabricating one or more semiconductor fin structures, the fabricating comprising:
providing a substrate structure comprising a first semiconductor material;
providing one or more fin stacks above the substrate structure, one fin stack of the one or more fin stacks comprising at least one semiconductor layer including a second semiconductor material;
depositing a conformal protective film over the one or more fin stacks and the substrate structure; and
etching the substrate structure using, at least in part, the one or more fin stacks as a mask to facilitate defining the one or more semiconductor fin structures, wherein the conformal protective film protects sidewalls of the at least one semiconductor layer from etching during the etching of the substrate structure.

2. The method of claim 1, wherein the second semiconductor material is, at least in part, a different semiconductor material from the first semiconductor material.

3. The method of claim 1, wherein the second semiconductor material comprises, at least in part, the first semiconductor material.

4. The method of claim 3, wherein the first semiconductor material comprises silicon, and the second semiconductor material comprises silicon-germanium.

5. The method of claim 1, wherein the one fin stack of the one or more fin stacks further comprises a hard mask layer above the at least one semiconductor layer, and wherein the conformal protective film covers exposed surfaces of the at least one semiconductor layer and the hard mask layer.

6. The method of claim 5, wherein the hard mask layer and the conformal protective film comprise a common material.

7. The method of claim 6, wherein the common material comprises silicon nitride.

8. The method of claim 1, wherein the conformal protective film has a thickness in a range of about 0.5 nm to 10 nm, where conformally wrapping over the one or more fin stacks.

9. The method of claim 1, wherein the etching further comprises removing the conformal protective film from over an upper portion of the substrate structure, while leaving the conformal protective film over sidewalls of the one or more fin stacks, and etching at least in part the first semiconductor material of the substrate structure.

10. The method of claim 1, wherein the fabricating further comprises removing the conformal protective film from sidewalls of the one or more fin stacks subsequent to the etching of the substrate structure.

11. The method of claim 1, wherein providing the substrate structure comprises providing a multilayer substrate structure, the multilayer substrate structure comprising a semiconductor substrate, a first semiconductor layer disposed over the semiconductor substrate, and a second semiconductor layer disposed over the first semiconductor layer, wherein the semiconductor substrate and the second semiconductor layer comprise the first semiconductor material, and the first semiconductor layer comprises the second semiconductor material.

12. The method of claim 11, wherein the second semiconductor material comprises, at least in part, the first semiconductor material.

13. The method of claim 12, wherein the first semiconductor material comprises silicon, and the second semiconductor material comprises silicon germanium.

14. The method of claim 11, wherein the one fin stack of the one or more fin stacks further comprises a hard mask layer above the at least one semiconductor layer, and wherein the conformal protective film covers exposed surfaces of the at least one semiconductor layer and the hard mask layer.

15. The method of claim 14, wherein the hard mask layer and the conformal protective film comprise a common material.

16. The method of claim 15, wherein the common material comprises silicon nitride.

17. The method of claim 11, wherein the etching comprises etching the first semiconductor layer and the second semiconductor layer of the multilayer substrate structure using, at least in part, the one or more fin stacks as a mask to facilitate defining the one or more semiconductor fin structures.

18. The method of claim 17, further comprising removing the first semiconductor layer within at least one semiconductor fin structure of the one or more semiconductor fin structures subsequent to the etching of the multilayer substrate structure, thereby defining an opening in the at least one fin structure.

19. The method of claim 18, further comprising disposing an insulator within the opening in at least one semiconductor fin structure to electrically isolate an upper portion of the at least one semiconductor for structure from the semiconductor substrate.

20. The method of claim 17, further comprising removing the conformal protective film from sidewalls of the one or more fin stacks subsequent to the removal of the first semiconductor layer from the at least one semiconductor fin structure, and etching at least in part the second semiconductor layer of the multilayer substrate structure.

* * * * *